United States Patent
Burke et al.

(10) Patent No.: US 8,362,548 B2
(45) Date of Patent: Jan. 29, 2013

(54) CONTACT STRUCTURE FOR SEMICONDUCTOR DEVICE HAVING TRENCH SHIELD ELECTRODE AND METHOD

(75) Inventors: Peter A. Burke, Portland, OR (US); Gordon M. Grivna, Mesa, AZ (US); Prasad Venkatraman, Gilbert, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 553 days.

(21) Appl. No.: 12/271,030

(22) Filed: Nov. 14, 2008

(65) Prior Publication Data

US 2010/0123187 A1    May 20, 2010

(51) Int. Cl.
*H01L 29/66* (2006.01)
(52) U.S. Cl. .......... 257/330; 257/332; 257/E29.152; 257/E29.154; 438/270
(58) Field of Classification Search .......... 257/328, 257/330, E29.152, E29.154, 332; 438/270
See application file for complete search history.

(56) References Cited

U.S. PATENT DOCUMENTS

| | | | |
|---|---|---|---|
| 4,455,565 A | 6/1984 | Goodman et al. | |
| 4,941,026 A | 7/1990 | Temple | |
| 5,763,915 A | 6/1998 | Hshieh et al. | |
| 5,877,528 A | 3/1999 | So | |
| 5,912,490 A | 6/1999 | Herbert et al. | |
| 5,998,833 A | 12/1999 | Baliga | |
| 6,388,286 B1 | 5/2002 | Baliga | |
| 6,621,121 B2 | 9/2003 | Baliga | |
| 6,750,508 B2 * | 6/2004 | Omura et al. | 257/329 |
| 6,764,889 B2 | 7/2004 | Baliga | |
| 6,787,848 B2 | 9/2004 | Ono et al. | |
| 7,005,347 B1 | 2/2006 | Bhalla et al. | |
| 7,183,610 B2 | 2/2007 | Pattanayak et al. | |
| 2005/0017293 A1* | 1/2005 | Zundel et al. | 257/329 |
| 2005/0167742 A1* | 8/2005 | Challa et al. | 257/328 |
| 2006/0273386 A1 | 12/2006 | Yilmaz et al. | |
| 2007/0290257 A1* | 12/2007 | Kraft et al. | 257/330 |
| 2008/0179662 A1 | 7/2008 | Hshieh | |
| 2008/0197407 A1 | 8/2008 | Challa et al. | |
| 2009/0020810 A1* | 1/2009 | Marchant | 257/331 |

OTHER PUBLICATIONS

Ishikawa and Esaki, A High-Power High-Gain VD-MOSFET Operating at 900 MHz, IEEE Transactios on Electron Devices, vol. ED-34, No. 5, pp. 1157-1162, May 1987.

* cited by examiner

*Primary Examiner* — Fernando L Toledo
*Assistant Examiner* — John C Ingham
(74) *Attorney, Agent, or Firm* — Kevin B. Jackson

(57) ABSTRACT

In one embodiment, a contact structure for a semiconductor device having a trench shield electrode includes a gate electrode contact portion and a shield electrode contact portion within a trench structure. Contact is made to the gate electrode and the shield electrode within or inside of the trench structure. A thick passivating layer surrounds the shield electrode in the contact portion.

22 Claims, 13 Drawing Sheets

CONTACT STRUCTURE FOR SEMICONDUCTOR DEVICE HAVING TRENCH SHIELD ELECTRODE AND METHOD

CROSS-REFERENCE TO RELATED APPLICATIONS

This application is related to an application entitled "SEMICONDUCTOR DEVICE HAVING TRENCH SHIELD ELECTRODE STRUCTURE" having an application Ser. No. 12/271,041, having a common assignee, and a common inventor, which is filed concurrently herewith.

This application is related to an application entitled "TRENCH SHIELDING STRUCTURE FOR SEMICONDUCTOR DEVICE AND METHOD" having an application Ser. No. 12/271,068, having a common assignee, and having a common inventor, which is filed concurrently herewith.

FIELD OF THE INVENTION

This document relates generally to semiconductor devices, and more specifically to insulated gate structures and methods of formation.

BACKGROUND OF THE INVENTION

Metal oxide field effect transistor (MOSFET) devices are used in many power switching applications such as dc-dc converters. In a typical MOSFET, a gate electrode provides turn-on and turn-off control with the application of an appropriate gate voltage. By way of example, in an n-type enhancement mode MOSFET, turn-on occurs when a conductive n-type inversion layer (i.e., channel region) is formed in a p-type body region in response to the application of a positive gate voltage, which exceeds an inherent threshold voltage. The inversion layer connects n-type source regions to n-type drain regions and allows for majority carrier conduction between these regions.

There is a class of MOSFET devices where the gate electrode is formed in a trench that extends downward from a major surface of a semiconductor material such as silicon. Current flow in this class of devices is primarily vertical and, as a result, device cells can be more densely packed. All else being equal, this increases the current carrying capability and reduces on-resistance of the device.

In certain applications, high frequency switching characteristics are important and certain design techniques have been used to reduce capacitive effects thereby improving switching performance. By way of example, it is previously known to incorporate an additional electrode below the gate electrode in trench MOSFET devices and to connect this additional electrode to the source electrode or another bias source. This additional electrode is often referred to as a "shield electrode" and functions, among other things, to reduce gate-to-drain capacitance. Shield electrodes have been previously used as well in planar MOSFET devices.

Although shield electrodes improve device performance, challenges still exist to more effectively integrate them with other device structures. These challenges include avoiding additional masking steps, addressing non-planar topographies, and avoiding excessive consumption of die area. These challenges impact, among other things, cost and manufacturability. Additionally, opportunities exist to provide devices having shield electrodes with more optimum and reliable performance.

Accordingly, structures and methods of manufacture are needed to effectively integrate shield electrode structures with other device structures and to provide more optimum and reliable performance.

For simplicity and clarity of illustration, elements in the figures are not necessarily drawn to scale, and the same reference numbers in different figures denote generally the same elements. Additionally, descriptions and details of well-known steps and elements may be omitted for simplicity of the description. As used herein current-carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of a MOS transistor or a base of a bipolar transistor. Although the devices are explained herein as certain N-channel devices, a person of ordinary skill in the art will appreciate that P-channel devices and complementary devices are also possible in accordance with the present description. For clarity of the drawings, doped regions of device structures are illustrated as having generally straight-line edges and precise angular corners. However, those skilled in the art understand that due to the diffusion and activation of dopants, the edges of doped regions are generally not straight lines and the corners are not precise angles.

In addition, structures of the present description may embody either a cellular base design (where the body regions are a plurality of distinct and separate cellular or stripe regions) or a single base design (where the body region is a single region formed in an elongated pattern, typically in a serpentine pattern or a central portion with connected appendages). However, one embodiment of the present description will be described as a cellular base design throughout the description for ease of understanding. It should be understood that it is intended that the present disclosure encompass both a cellular base design and a single base design.

DETAILED DESCRIPTION OF THE DRAWINGS

In general, the present description pertains to a semiconductor device formed on a region of semiconductor material having a major surface. The semiconductor device includes a trench structure with a control electrode layer and a shield electrode layer. The semiconductor device further includes a contact structure where the control electrode layer and the shield electrode layer terminate. In one embodiment, the control electrode layer and the shield electrode layer are recessed below the major surface. In one embodiment, contact is made to both the control electrode layer and the shield electrode layer inside of the trench structure. In another embodiment, the shield electrode layer is surrounded by a thick insulator layer adjacent the major surface in the contact structure.

Figure 1:
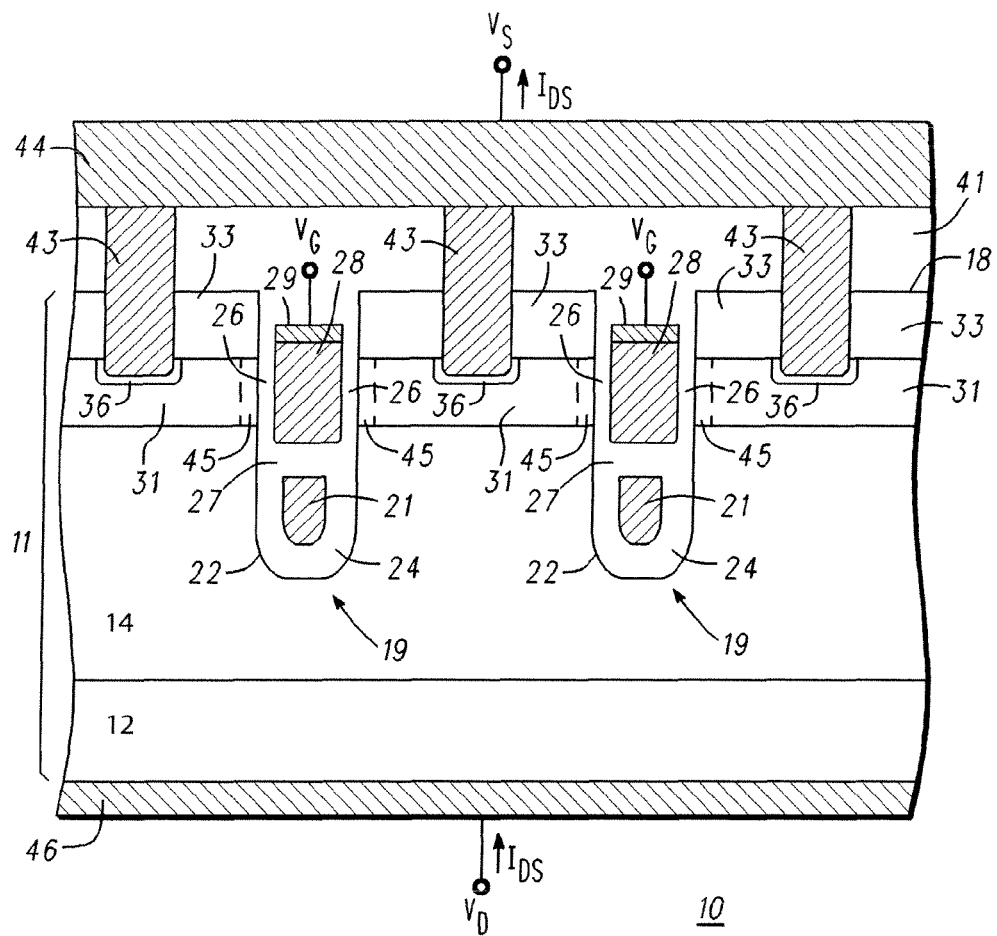
FIG. 1 illustrates a partial cross-sectional view of a first embodiment of a semiconductor structure taken along reference line I-I of FIG. 2.

FIG. 1 shows a partial cross-sectional view of a semiconductor device or cell 10 having a shield electrode or electrodes 21. The cross-section is taken, for example, along reference line I-I from active area 204 of device 20 shown in FIG. 2. In this embodiment, device 10 comprises a MOSFET structure, but it is understood that this description applies as well to insulated gate bipolar transistors (IGBT), MOS-gated thyristors, and the like.

Device 10 includes a region of semiconductor material, semiconductor material, or semiconductor region 11, which comprises for example, an n-type silicon substrate 12 having a resistivity in a range from about 0.001 ohm-cm to about 0.005 ohm-cm. Substrate 12 can be doped with phosphorous or arsenic. In the embodiment shown, substrate 12 provides a drain contact or a first current carrying contact for device 10. A semiconductor layer, drift region, or extended drain region 14 is formed in, on, or overlying substrate 12. In one embodiment, semiconductor layer 14 is formed using conventional epitaxial growth techniques. Alternatively, semiconductor layer 14 is formed using conventional doping and diffusion techniques. In an embodiment suitable for a 50 volt device, semiconductor layer 14 is n-type with a dopant concentration of about $1.0 \times 10^{16}$ atoms/cm$^3$ and has a thickness from about 3 microns to about 5 microns. The thickness and dopant concentration of semiconductor layer 14 is increased or decreased depending on the desired drain-to-source breakdown voltage (BV$_{DSS}$) rating of device 10. It is understood that other materials may be used for semiconductor material 11 or portions thereof including silicon-germanium, silicon-germanium-carbon, carbon-doped silicon, silicon carbide, or the like. Additionally, in an alternate embodiment, the conductivity type of substrate 12 is switched to be opposite the conductivity type of semiconductor layer 14 to form, for example, an IGBT embodiment.

Device 10 also includes a body, base, PHV, or doped region or regions 31 extending from a major surface 18 of semiconductor material 11. Body regions 31 have a conductivity type that is opposite to the conductivity type of semiconductor layer 14. In this example, body regions 31 are p-type conductivity. Body regions 31 have a dopant concentration suitable for forming inversion layers that operate as conduction channels or channel regions 45 of device 10. Body regions 31 extend from major surface 18 to a depth, for example, from about 0.5 microns to about 2.0 microns. N-type source regions, current conducting regions, or current carrying regions 33 are formed within, in, or overlying body regions 31 and extend from major surface 18 to a depth, for example, from about 0.1 microns to about 0.5 microns. A p-type body contact or contact region 36 can be formed in body regions 31, and is configured to provide a lower contact resistance to body regions 31.

Device 10 further includes trench control, trench gate, or trench structures 19, which extend in a substantially vertical direction from major surface 18. Alternatively, trench control structures 19 or portions thereof have a tapered shape. Trench structures 19 include trenches 22, which are formed in semiconductor layer 14. For example, trenches 22 have a depth from about 1.5 microns to about 2.5 microns or deeper. In one embodiment, trenches 22 extend all the way through semiconductor layer 14 into substrate 12. In another embodiment, trenches 22 terminate within semiconductor layer 14.

Passivating layers, insulator layers, field insulator layers or regions 24 are formed on lower portions of trenches 22 and comprise, for example, an oxide, a nitride, combinations thereof, or the like. In one embodiment, insulator layers 24 are silicon oxide and have a thickness from about 0.1 microns to about 0.2 microns. Insulator layers 24 can be uniform in thickness or variable thickness. Additionally, the thickness of layer 24 may be varied, depending on the desired drain-to-source breakdown voltage (BV$_{DSS}$). Shield electrodes 21 are formed overlying insulator layers 24 in substantially centrally located lower portions of trenches 22. In one embodiment, shield electrodes 21 comprise polycrystalline semiconductor material that can be doped. In another embodiment, shield electrodes 21 can comprise other conductive materials. In contact structure embodiments described below, portions of trenches 22 in the contact structure areas have insulator layers 24 along upper sidewall portions as well.

Passivating, dielectric, or insulator layers 26 are formed along upper sidewall portions of trenches 22 and are configured as gate dielectric regions or layers. By way of example, insulator layers 26 comprise oxide, nitride, tantalum pentoxide, titanium dioxide, barium strontium titanate, combinations thereof, or the like. In one embodiment, insulator layers 26 are silicon oxide and have a thickness from about 0.01 microns to about 0.1 microns. In one embodiment, insulator layers 24 are thicker than insulator layers 26. Passivating, dielectric, or insulator layers 27 are formed overlying shield electrodes 21, and in one embodiment insulator layers 27 have a thickness between the thickness of insulator layers 24 and insulator layers 26. In one embodiment, insulator layers 27 have a thickness greater than the thickness of insulator layer 26, which improves oxide breakdown voltage performance.

Trench structures 19 further include control electrodes or gate electrodes 28, which are formed overlying insulator layers 26 and 27. In one embodiment, gate electrodes 28 comprise doped polycrystalline semiconductor material such as polysilicon doped with an n-type dopant. In one embodiment, trench structures 19 further include a metal or silicide layer 29 formed adjoining gate electrode 28 or upper surfaces thereof. Layer 29 is configured to reduce gate resistance.

An interlayer dielectric (ILD), dielectric, insulator, or passivating layer 41 is formed overlying major surface 18 and above trench structures 19. In one embodiment, dielectric layer 41 comprises a silicon oxide and has a thickness from about 0.4 microns to about 1.0 micron. In one embodiment, dielectric layer 41 comprises a deposited silicon oxide doped with phosphorous or boron and phosphorous. In one embodiment, dielectric layer 41 is planarized to provide a more uniform surface topography, which improves manufacturability.

Conductive regions or plugs 43 are formed through openings or vias in dielectric layer 41 and portions of semiconductor layer 14 to provide for electrical contact to source regions 33 and body regions 31 through contact regions 36. In one embodiment, conductive regions 43 are conductive plugs or plug structures. In one embodiment, conductive regions 43 comprise a conductive barrier structure or liner plus a conductive fill material. In one embodiment, the barrier structure includes a metal/metal-nitride configuration such as titanium/titanium-nitride or the like. In another embodiment, the barrier structure further includes a metal-silicide structure. In one embodiment, the conductive fill material includes tungsten. In one embodiment, conductive regions 43 are planarized to provide a more uniform surface topography.

A conductive layer 44 is formed overlying major surface 18 and a conductive layer 46 is formed overlying a surface of semiconductor material 11 opposite major surface 18. Conductive layers 44 and 46 are configured to provide electrical connection between the individual device components of device 10 and a next level of assembly. In one embodiment, conductive layer 44 is titanium/titanium-nitride/aluminum-copper or the like and is configured as a source electrode or terminal. In one embodiment, conductive layer 46 is a solderable metal structure such as titanium-nickel-silver, chromium-nickel-gold, or the like and is configured as a drain electrode or terminal. In one embodiment, a further passivation layer (not shown) is formed overlying conductive layer 44. In one embodiment, shield electrodes 21 are connected (in another plane) to conductive layer 44 so that shield electrodes 21 are configured to be at the same potential as source regions 33 when device 10 is in use. In another embodiment, shield electrodes 21 are configured to be independently biased.

In one embodiment, the operation of device 10 proceeds as follows. Assume that source electrode (or input terminal) 44 and shield electrodes 21 are operating at a potential $V_S$ of zero volts, gate electrodes 28 receive a control voltage $V_G$ of 2.5 volts, which is greater than the conduction threshold of device 10, and drain electrode (or output terminal) 46 operates at a drain potential $V_D$ of 5.0 volts. The values of $V_G$ and $V_S$ cause body region 31 to invert adjacent gate electrodes 28 to form channels 45, which electrically connect source regions 33 to semiconductor layer 14. A device current $I_{DS}$ flows from drain electrode 46 and is routed through source regions 33, channels 45, and semiconductor layer 14 to source electrode 44. In one embodiment, $I_{DS}$ is on the order of 1.0 amperes. To switch device 10 to the off state, a control voltage $V_G$ of less than the conduction threshold of device 10 is applied to gate electrodes 28 (e.g., $V_G$<2.5 volts). This removes channels 45 and $I_{DS}$ no longer flows through device 10.

Shield electrodes 21 are configured to control the width of the depletion layer between body region 31 and semiconductor layer 14, which enhances source-to-drain breakdown voltage. Also, shield electrodes 21 help reduce gate-to-drain charge of device 10. Additionally, because there is less overlap of gate electrode 28 with semiconductor layer 14 compared to other structures, the gate-to-drain capacitance of device 10 is reduced. These features enhance the switching characteristics of device 10.

Figure 2:
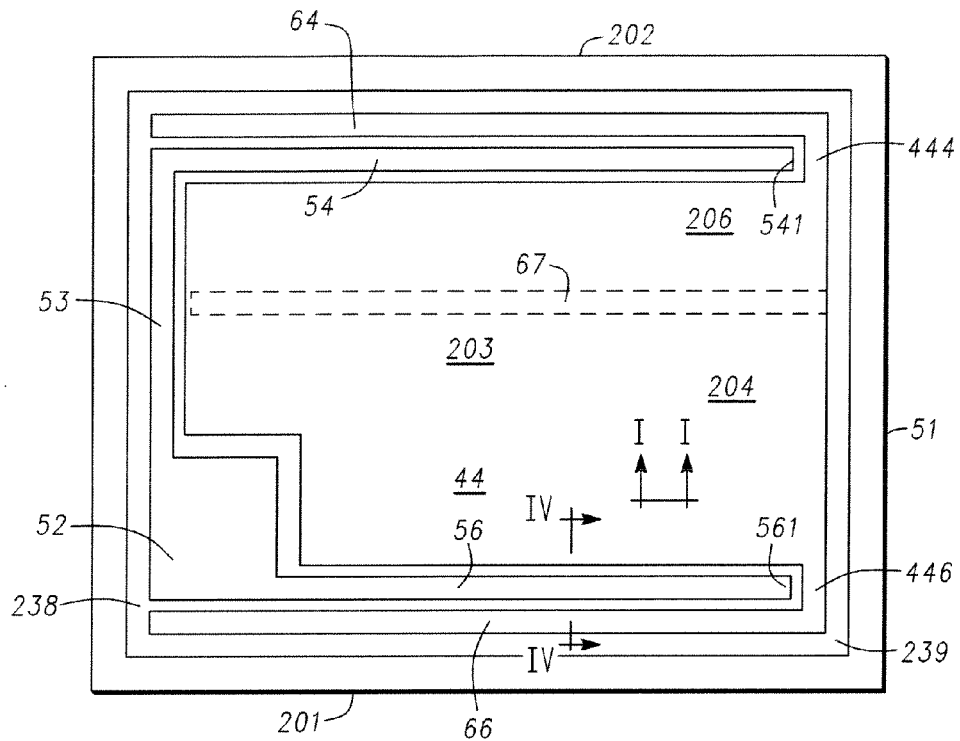
FIG. 2 illustrates a top plan view of a first embodiment of a semiconductor device including the structure of FIG. 1.

FIG. 2 shows a top plan view of a semiconductor device, die or chip 20 that includes device 10 of FIG. 1. For perspective, FIG. 2 is generally looking down at major surface 18 of semiconductor material 11 shown in FIG. 1. In this embodiment, device 20 is bounded by a die edge 51, which can be the center of a scribe line used to separate chip 20 from other devices when in wafer form. Device 20 includes a control pad, gate metal pad or gate pad 52, which is configured to electrically contact gate electrodes 28 (shown in FIG. 1) through gate metal runners or gate runners or feeds 53, 54, and 56. In this embodiment, gate metal pad 52 is placed in a corner portion 238 of device 20. In one embodiment, gate runner 54 is adjacent to an edge 202 of device 20, and gate runner 56 is adjacent another edge 201 of device 20, which is opposite to edge 202. In one embodiment, trenches 22 extend in a direction from edge 201 to edge 202. In one embodiment, central portion 203 of device 20 is absent any gate runner(s). That is, in one embodiment the gate runners are placed in only peripheral or edge portions of device 20.

Conductive layer 44, which is configured in this embodiment as a source metal layer, is formed over active portions 204 and 206 of device 20. In one embodiment, portion 444 of conductive layer 44 wraps around end portion 541 of gate runner 54. A portion 446 of conductive layer 44 wraps around end portion 561 of gate runner 56 and is designated as structure 239. Structure 239 is further shown in more detail in FIG. 24. Conductive layer 44 is further configured to form shield electrode contacts, runners, or feeds 64 and 66, which in this embodiment provide contact to shield electrodes 21. In this configuration, conductive layer 44 is connected to shield electrodes 21. In the wrap around configuration described above, conductive layer 44, portions 444 and 446, shield electrode runners 64 and 66 and gate runners 54 and 56 are in the same plane and do not overlap each other. This configuration provides for the use of a single metal layer, which simplifies manufacturing.

In one embodiment, shield electrode runner 66 is placed between edge 201 of device 20 and gate runner 56, and shield electrode runner 64 is placed between edge 202 of device 20 and gate runner 54. In one embodiment, additional contact is made to shield electrodes 21 in shield contact region, contact region or stripe 67, which separates the active area of device 20 into portions 204 and 206. Contact region 67 is another location on device 20 where contact between conductive layer 44 and shield electrodes 21 is made. Contact region 67 is configured to divide gate electrodes 28 into two portions within device 20. The two portions include one portion that feeds from gate runner 54 and another portion that feeds from gate runner 56. In this configuration, gate electrode material 28 is absent from contact region 67. That is, gate electrodes 28 do not pass through contact region 67.

In embodiments that place gate pads 52 in a corner (e.g., corner 23) of device 20, the effects of gate resistance can be more optimally distributed through a selected or predetermined placement of contact region 67 within device 20. This predetermined placement provides more uniform switching characteristics. In one embodiment, contact region 67 is offset from center 203 so that contact region 67 is closer to edge 202 than edge 201 with gate pad 52 in corner portion 238 adjacent to edge 201. That is, contact region 67 is placed closer to the edge opposite to the corner and edge where gate pad 52 is placed. This configuration decreases the length of gate electrodes 28 in active area 206 and increases the length of gate electrodes 28 in active area 204, which provides for a more efficient distribution of the gate resistance load.

In one embodiment, contact region 67 is placed in an offset location on device 20 to reduce gate resistance in active area 206 by about one half the resistance of gate runner 53, and to increase gate resistance in active area 204 by about one half the resistance of gate runner 53. In this embodiment, the gate resistance of active area 206 is given by:

$$2Rg_{FET206}+R_{53}-(R_{53}/2)$$

where Rg$_{FET206}$ is the resistance of gate electrodes 28 in active area 206 when contact region 67 is placed in the center of device 20, and R$_{53}$ is the resistance of metal runner 53. The gate resistance of active area 204 is given by:

$$2Rg_{FET204}+R_{53}/2$$

where Rg$_{FET204}$ is the resistance of gate electrodes 28 in active area 204 when contact region 67 is placed in the center of device 20. This is an example of a predetermined placement of contact region 67 that optimizes the distribution of gate resistance.

In another embodiment, shield contact region 67 is the only shield contact used to make contact to shield electrodes 21 and is placed in an interior portion of device 20. That is, in this embodiment shield electrode runners 64 and 66 are not used. This embodiment is appropriate, for example, when switching speeds are not as critical, but where the resurf effect of the shield electrode is desired. In one embodiment, shield contact region 67 is placed in the center of device 20. In another embodiment, shield contact region 67 is placed offset from center of device 20. In these embodiments, shield contact region 67 provides contact to shield electrodes 21 within or inside of trenches 22 while control electrode runners 54 and 56 make contact to control electrodes 28 within or inside trenches 22 near edges 201 and 202. This embodiment further saves on space within device 20. In another embodiment, control electrodes 28 extend and overlap onto major surface 18 and control electrode runners 54 and 56 make contact to control electrodes outside of trenches 22.

Figure 3:
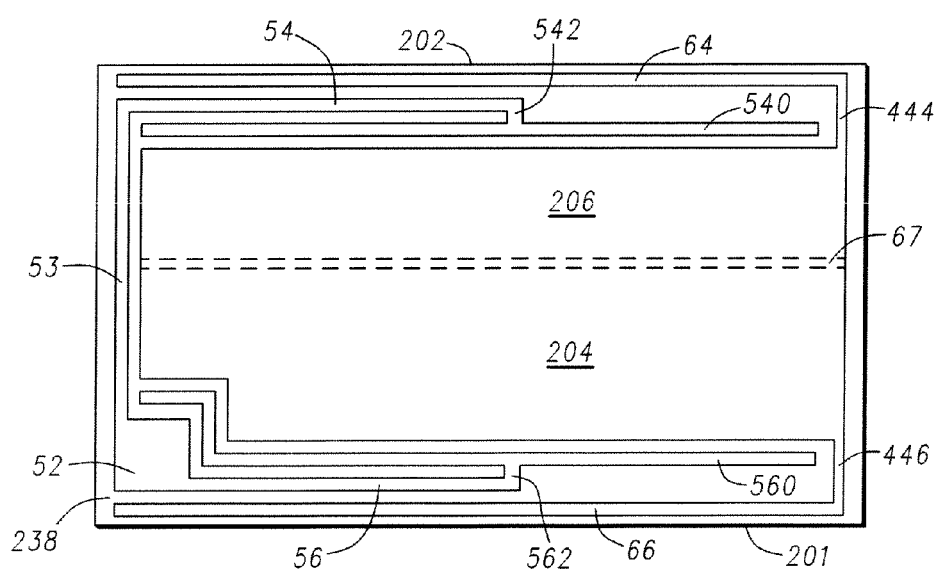
FIG. 3 illustrates a top plan view of a second embodiment of a semiconductor device.

FIG. 3 is a top view of another embodiment of a semiconductor device, die or chip 30. In this embodiment, gate pad 52 is placed in corner portion 238 of device 30 similar to device 20. Device 30 is similar to device 20 except that gate runners 54 and 56 are configured to decrease the left-to-right non-uniformity of gate resistance. In one embodiment, gate runner 56 feeds, connects, or links into an additional gate runner 560 at a substantially central location 562. Gate runner 560 then connects to gate electrodes 28 (shown in FIG. 1) in active area 204. In another embodiment, gate runner 54 feeds, connects, or links into gate runner 540 at a substantially central location 542. Gate runner 540 then connects to gate electrodes 28 (shown in FIG. 1) in active area 206. It is understood that one or both of gate runners 54 and 56 can be configured this way. Also, if used shield contact region 67 can be offset in device 30 as shown in FIG. 2. In one embodiment, shield electrode runner 66 is placed between gate runners 56 and 560 and edge 201, and shield electrode runner 64 is placed between gate runners 54 and 540 and edge 202. The gate runner configuration of FIG. 3 can be used as well in devices that do not include shield electrodes to reduce left-to-right non-uniformity of gate resistance.

Figure 4:
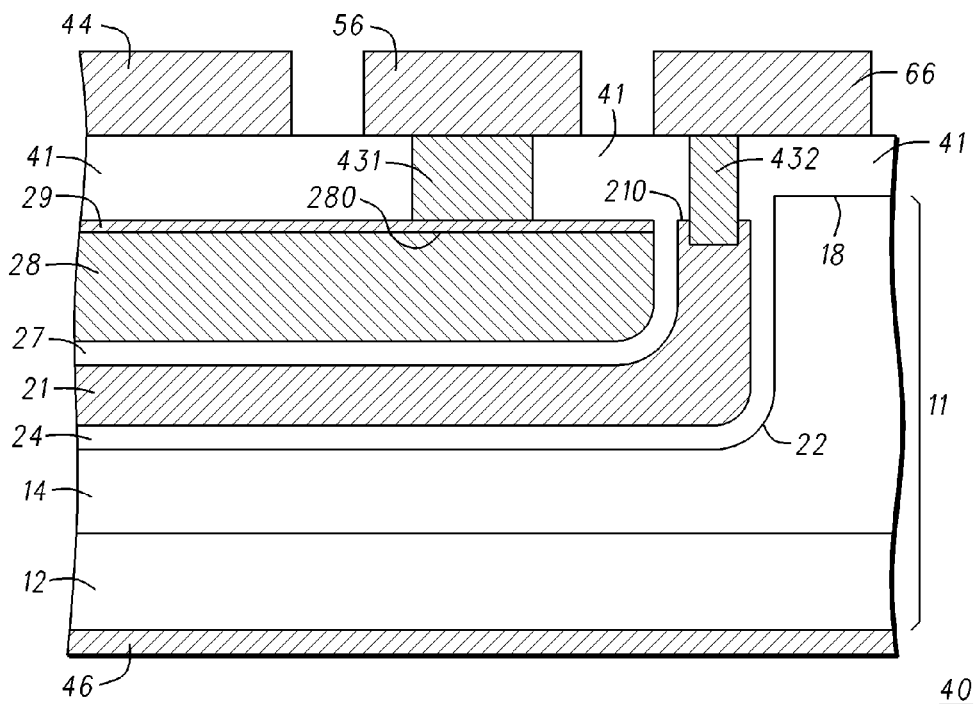
FIG. 4 illustrates a partial cross-sectional view of a portion of the semiconductor device of FIG. 2 taken along reference line IV-IV.

FIG. 4 shows an enlarged cross-sectional view of a gate/shield electrode contact structure, connective structure, or contact structure or region 40, which is taken along reference line IV-IV in FIG. 2. In general, structure 40 is a contact area where contact is made between gate electrodes 28 and gate runners 54 and 56, and where contact is made between shield electrodes 21 and shield electrode runners 64 and 66. In previously known gate/shield electrode contact structures, a double stack of polysilicon or other conductive material is placed on top of the major surface of a substrate in peripheral or field regions of the device to enable contact to be made. Such double stacks of material can add in excess of 1.2 microns to surface topography. The double stacks of material on the major surface create several problems that include a surface topography that is non-planar, which affects subsequent photolithography steps and manufacturability. These previously known structures also increase die size.

Structure 40 is configured to address, among other things, the double polysilicon stack problem with previously known devices. Specifically, upper surface 210 of shield electrode 21 and upper surface 280 of gate electrode 28 are both recessed below major surface 18 of semiconductor material 11 so that contact is made to shield electrodes 21 and gate electrodes 28 within or directly inside of trenches 22. That is, in one embodiment gate electrodes 28 and shield electrodes 21 do not overlap or extend on to major surface 18. A conductive structure 431 connects gate runner 56 to gate electrode 28, and a conductive structure 432 connects shield electrode runner 66 to shield electrode 21. Conductive structures 431 and 432 are similar to conductive structures 43 as described in conjunction with FIG. 1. Structure 40 uses planarized dielectric layer 41 and planarized conductive structures 431 and 432 to provide a more planar topography. This structure enables deep submicron lithography and global planarization in power device technology. In addition, this configuration enables portion 444 of conductive layer 44 to wrap around end portion 541 of gate runner 54 (as shown in FIG. 2), and portion 446 to wrap around end portion 561 of gate runner 56 (as shown in FIG. 2) and to do so without consuming too much die area.

Figure 25:
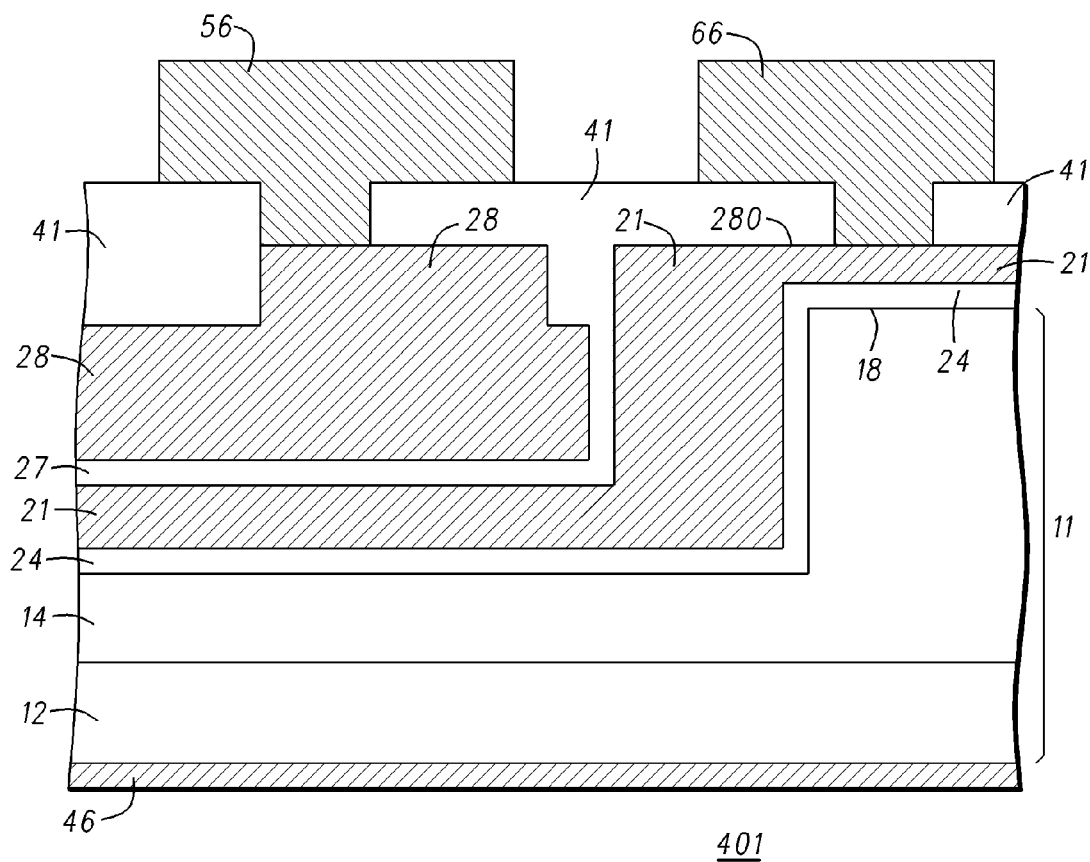
FIG. 25 illustrates a cross-sectional view of another embodiment of a semiconductor device.

In another embodiment, shield electrode 21 overlaps onto major surface 18 and contact to shield electrode 21 is made there while gate electrode 28 remains within trenches 22 without overlapping upper surface 210 of shield layer 21 or major surface 18 and contact to gate electrode 28 is made within or above trenches 22. This embodiment is shown in FIG. 25, which is cross-sectional view of a structure 401, which is similar to structure 40 except shield electrode 21 overlaps major surface 18 as described above. In this embodiment, shield electrodes 21 and conductive layer 44 wrap-around end portions 541 and 561 (shown in FIG. 2) and source metal 44 makes contact to shield electrodes 21 through openings in dielectric layer 41.

Another feature of structure 40 is that insulator layers 24 and 27, which are thicker than insulator layer 26 (shown in FIG. 1), surround and overlie shield electrode 21 even where shield electrode 21 approaches major surface 18. In previously known structures, a thinner gate oxide separates the gate electrode from the shield electrode in the field or peripheral regions. In previously known structures oxide is also thinner at the top surface-to-trench interface where both gate shield routing is made. However, such structures, where gate or shield oxides are thinned, are susceptible to oxide breakdown and device failure. Structure 40 reduces this susceptibility by using thicker insulator layers 24 and 27. This feature is further shown in FIGS. 17-18.

Figure 5:
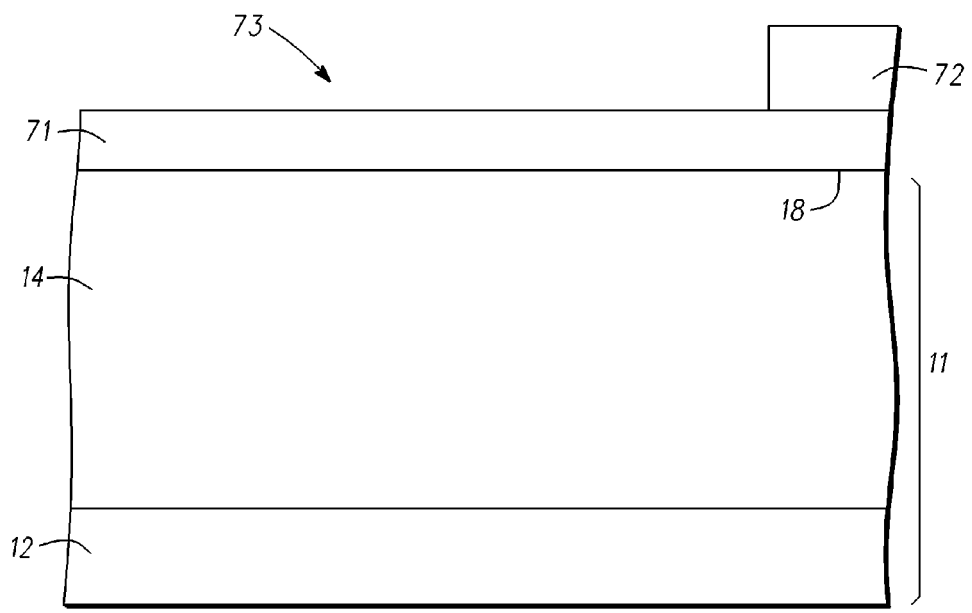
FIGS. 5-16 illustrate partial cross-sectional views of the portion of FIG. 4 at various stages of fabrication.

Turning now to FIGS. 5-16, which are partial cross-sectional views, a method of manufacturing structure 40 of FIG. 4 is described. It is understood that the process steps used to form structure 40 can be the same steps used to form device 10 of FIG. 1 as well as the shielding structures described in FIGS. 20-23. FIG. 5 shows structure 40 at an early step of fabrication. A dielectric layer 71 is formed over major surface 18 of semiconductor material 11. In one embodiment, dielectric layer 71 is an oxide layer such as a low temperature deposited silicon oxide, and has a thickness from about 0.25 microns to about 0.4 microns. Next, a masking layer such as a patterned photoresist layer 72 is formed over dielectric layer 71 and then dielectric layer 71 is patterned to provide an opening 73. In this embodiment, opening 73 corresponds to one of many trench openings for forming trenches 22. The unmasked portion of dielectric layer 71 is then removed using conventional techniques and layer 72 is then removed.

Figure 6:
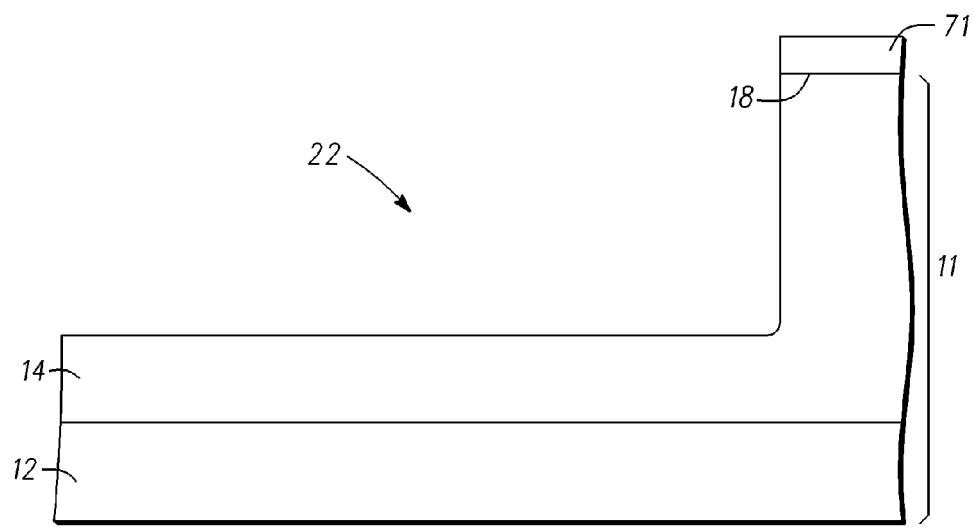

FIG. 6 shows structure 40 after one of trenches 22 has been etched into semiconductor layer 14. For perspective, this view is parallel to the direction that trenches 22 run on devices 20 and 30. That is, in FIG. 6 trench 22 runs left to right. By way of example, trenches 22 are etched using plasma etching techniques with a fluorocarbon chemistry. In one embodiment, trenches 22 have a depth of about 2.5 microns, and a portion of dielectric layer 71 is removed during the process used to form trenches 22. In one embodiment, trenches 22 have a width of about 0.4 microns and can taper or flare out to 0.6 microns where, for example, conductive structures 431 and 432 are formed to electrically connect gate electrodes 28 and shield electrodes 21 to gate runners 54 or 56 and shield electrode runners 56 or 66 respectively. Surfaces of trenches 22 can be cleaned using conventional techniques after they are formed.

Figure 7:
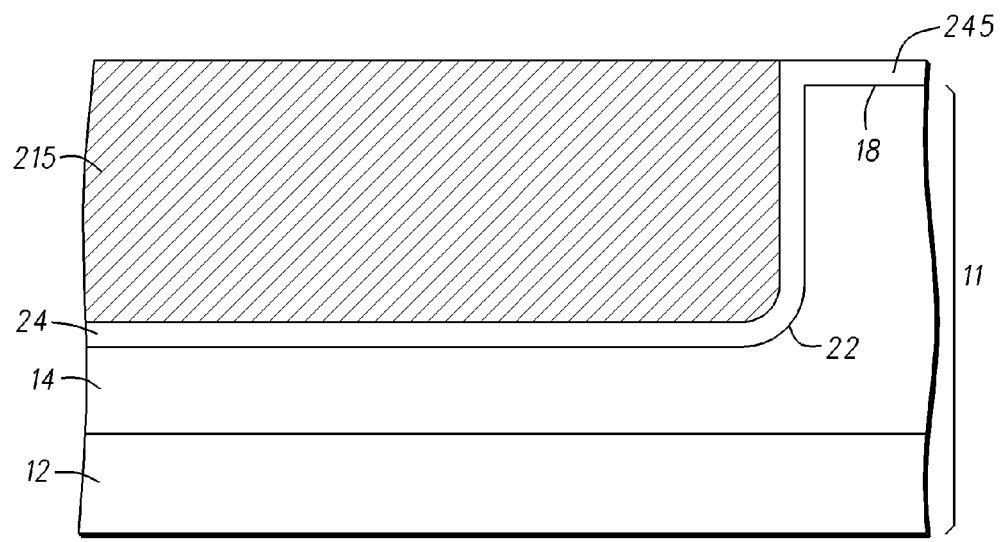

FIG. 7 shows structure 40 after additional processing. A sacrificial oxide layer having a thickness of about 0.1 microns is formed overlying surfaces of trenches 22. This process is configured to provide a thicker oxide towards the top of trenches 22 compared to lower portions of trenches 22, which places a slope in the trench. This process also removes damage and forms curves along lower surfaces of trenches 22. Next, the sacrificial oxide layer and dielectric layer 71 are removed. Insulator layer 24 is then formed over surfaces of trenches 22. By way of example, insulator layer 24 is a silicon oxide and has a thickness from about 0.1 microns to about 0.2 microns. A layer of polycrystalline semiconductor material is then deposited overlying major surface 18 and within trenches 22. In one embodiment, the polycrystalline semiconductor material comprises polysilicon and is doped with phosphorous. In one embodiment, the polysilicon has a thickness from about 0.45 microns to about 0.5 microns. In one embodiment, the polysilicon is annealed at an elevated temperature to reduce or eliminate any voids. The polysilicon is then planarized to form region 215. In one embodiment, the polysilicon is planarized using a chemical mechanical planarization process that is preferentially selective to polysilicon. Region 215 is planarized to portion 245 of insulator layer 24, which is configured as a stop layer.

Figure 8:
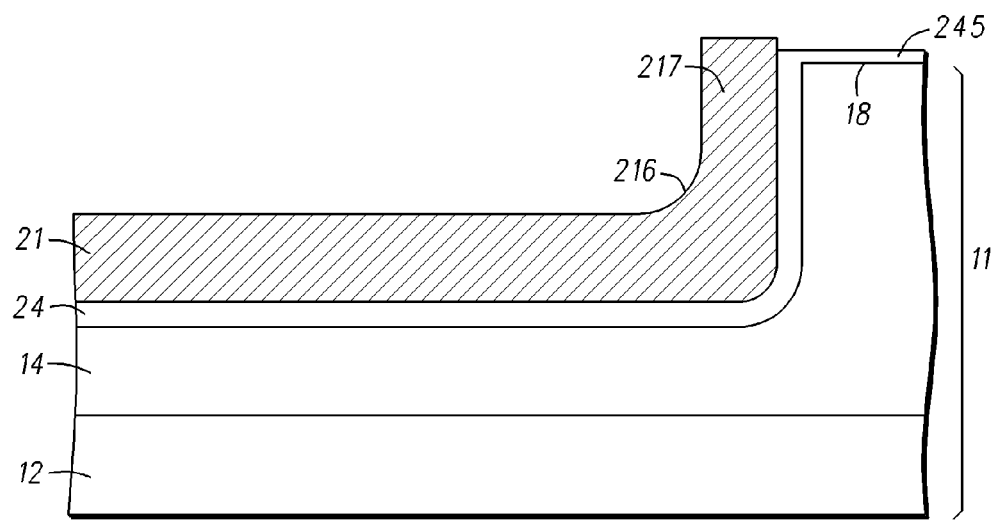
Figure 9:
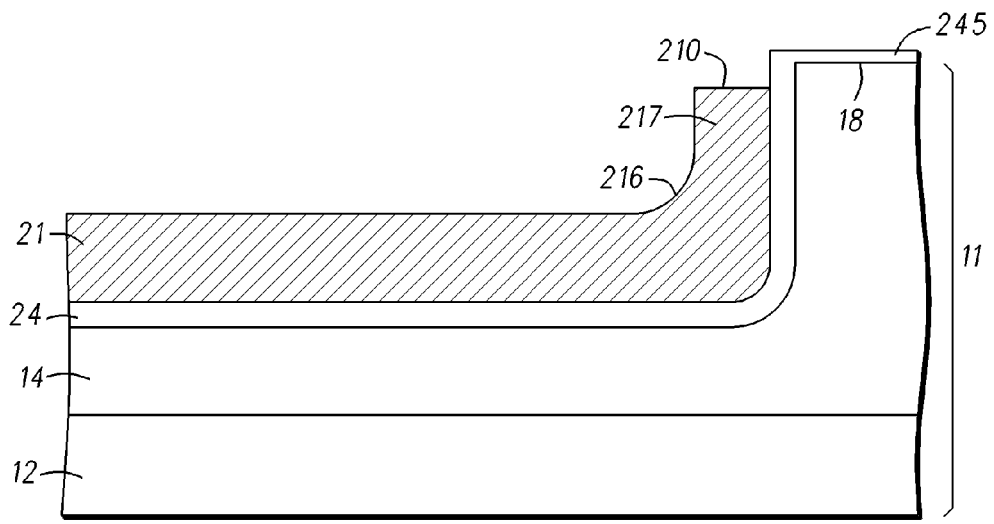

FIG. 8 shows structure 40 after subsequent processing. A masking layer (not shown) is formed overlying structure 40 and patterned to protect those portions of region 215 that will not be etched such as portion 217. Exposed portions of region 215 are then etched so that the etched portions are recessed below major surface 18 to form shield electrodes 21. In one embodiment, region 215 is etched to about 0.8 microns below major surface 18. In one embodiment, a selective isotropic etch is used for this step. The isotropic etch further provides a rounded portion 216 where shield electrode 21 transitions into portion 217, which extends upward towards major surface 18. This step further clears polycrystalline semiconductor material from exposed portions of the upper surfaces of trenches 22. Any remaining masking materials can then be removed. In one embodiment, portion 245 of insulator layer 24 is exposed to an etchant to reduce its thickness. In one embodiment, about 0.05 microns are removed. Next, additional polycrystalline material is removed from shield electrode 21 so that upper surface 210 of shield electrode 21 including portion 217 is recessed below major surface 18 as shown in FIG. 9. In one embodiment, about 0.15 microns of material is removed.

Figure 10:
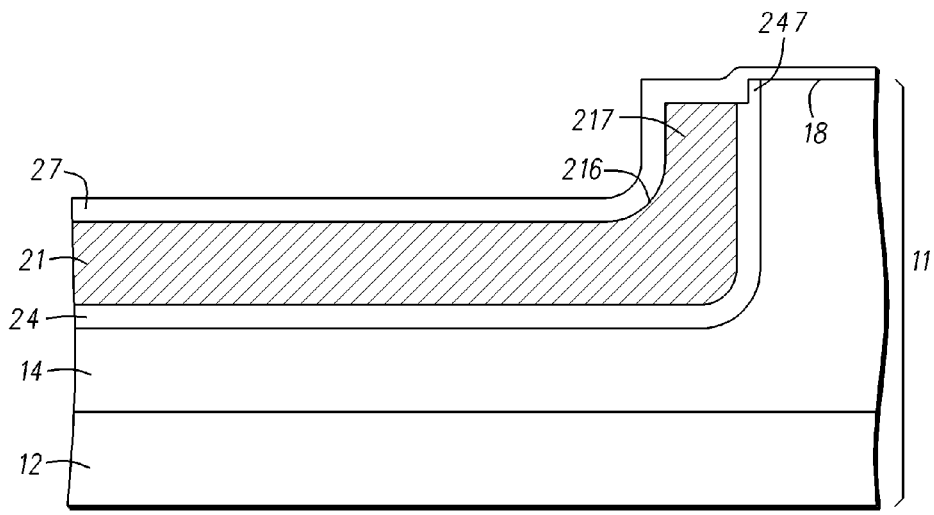

FIG. 10 shows structure 40 after still further processing. A portion of insulator layer 24 is removed where portion 217 of shield electrode 21 has been recessed. This forms an oxide stub structure 247, which is configured to reduce stress effects during subsequent processing steps. After oxide stub structure 247 is formed, an oxide layer (not shown) is formed overlying shield electrode 21 and upper surfaces of trenches 22. In one embodiment, a thermal silicon oxide growth process is used, which grows a thicker oxide overlying shield electrode 21 because shield electrode 21 is a polycrystalline material and a thinner oxide along exposed sidewalls of trenches 22 because these sidewalls are substantially monocrystalline semiconductor material. In one embodiment silicon oxide is grown and has a thickness of about 0.05 microns on sidewalls of trenches 22. This oxide helps to smooth the upper surfaces of shield electrodes 21. This oxide is then removed from the sidewalls of trenches 22 while leaving a portion of the oxide overlying shield electrode 21. Next, insulator layer 26 is formed overlying the upper sidewalls of trenches 22, which also increases the thickness of the dielectric material already overlying or formed on shield electrode 21 to form insulator layer 27 thereon. In one embodiment, a silicon oxide is grown to form insulator layers 26 and 27. In one embodiment, insulator layer 26 has a thickness of about 0.05 microns, and insulator layer 27 has a thickness greater than about 0.1 microns.

Figure 11:
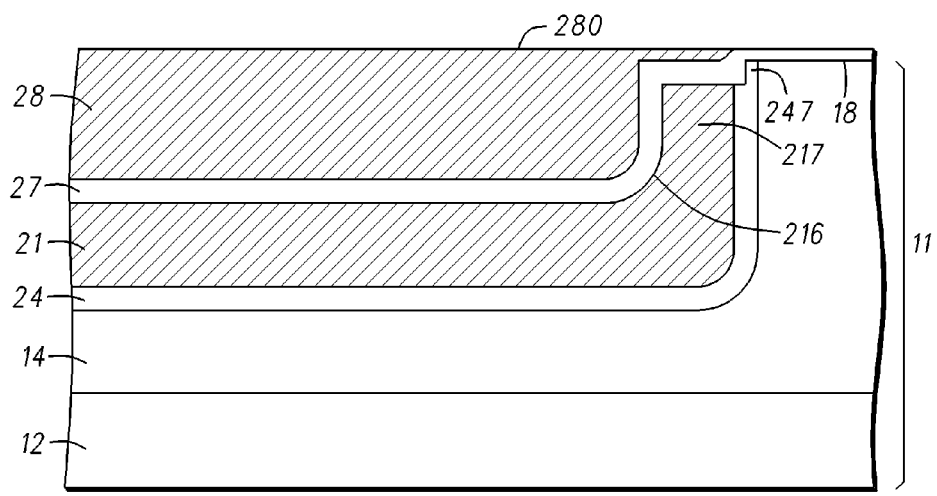

FIG. 11 shows structure 40 after polycrystalline semiconductor material has been formed overlying major surface 18. In one embodiment, doped polysilicon is used with phosphorous being a suitable dopant. In one embodiment about 0.5 microns of polysilicon is deposited overlying major surface 18. In one embodiment, the polysilicon is then annealed at an elevated temperature to remove any voids. Any surface oxide is then removed using conventional techniques, and the polysilicon is then planarized to form gate electrodes 28. In one embodiment, chemical mechanical planarization is used with the oxide overlying major surface 18 providing a stop layer.

Figure 12:
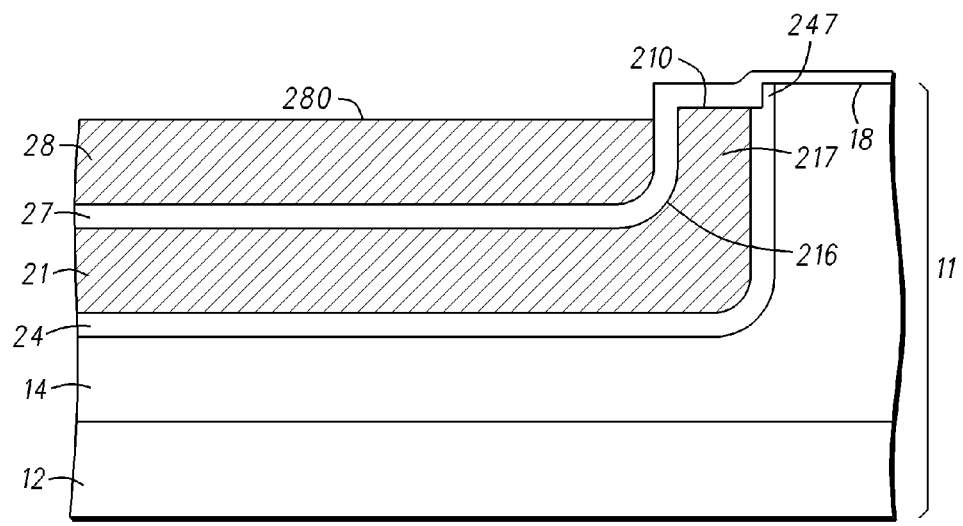

Next, gate electrodes 28 are subjected to an etch process to recess upper surface 280 below major surface 18 as shown in FIG. 12. In one embodiment, dry etching is used to recess upper surface 280 with a chemistry that is selective with respect to polysilicon and silicon oxide. In one embodiment, a chlorine chemistry, a bromine chemistry, or a mixture of the two chemistries is used for this step. It is convenient to use this etch step to remove polycrystalline semiconductor from the oxide layer above surface 210 of portion 217 so that when a silicide layer is used with gate electrode 28, it does not form above surface 210, which would complicate the contacting of shield electrode 21 in subsequent process steps.

Figure 13:
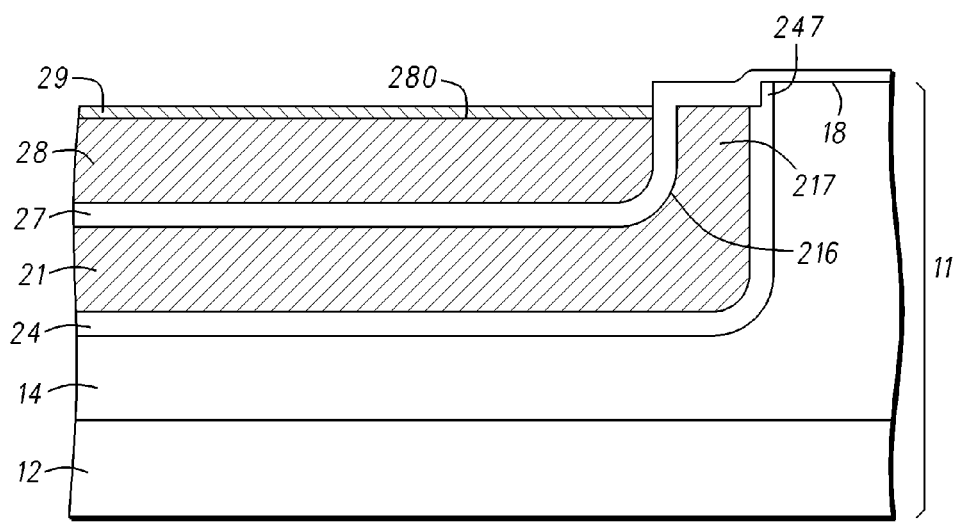

FIG. 13 shows structure 40 after silicide layer 29 has been formed overlying surface 280. In one embodiment, silicide layer 29 is titanium. In another embodiment, silicide layer 29 is cobalt. In a further embodiment, a self-aligned silicide (salicide) process is used to form layer 29. For example, in a first step, any residual oxide is removed from major surface 280. Then, titanium or cobalt is deposited overlying structure 40. Next, a lower temperature rapid thermal step (about 650 degrees Celsius) is used to react the metal and exposed polycrystalline semiconductor material. Structure 40 is then etched in a selective etchant to remove only unreacted titanium or cobalt. A second rapid thermal step at a higher temperature (greater than about 750 degrees Celsius) is then used to stabilize the film and lower its resistivity to form layer 29.

Figure 14:
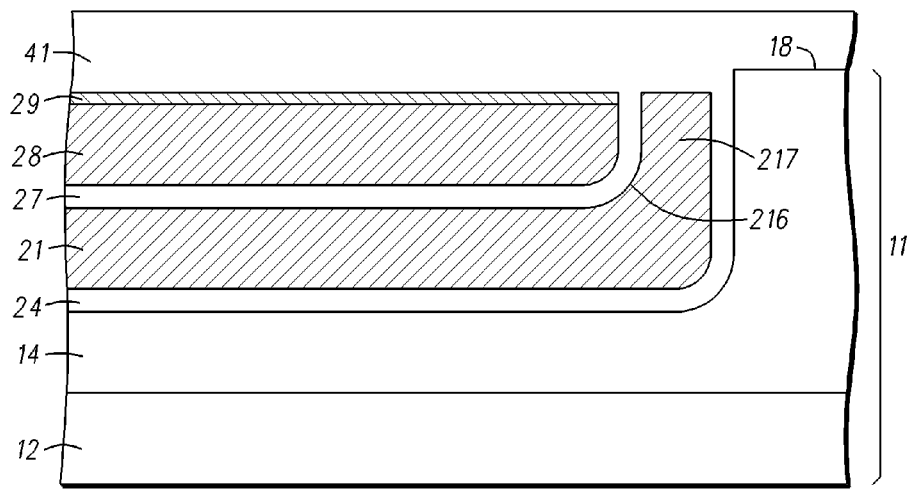

In a next sequence of steps, ILD 41 is formed overlying structure 40 as shown in FIG. 14. In one embodiment, about 0.5 microns of phosphorous doped silicon oxide is deposited using atmospheric pressure chemical vapor deposition. Next, about 0.5 microns of silane based plasma-enhanced chemical vapor deposited oxide is formed on or over the phosphorous doped oxide. The oxide layers are then planarized back to a final thickness of about 0.7 microns using, for example, chemical mechanical planarization to form ILD 41. In FIG. 14, insulator layer 27 and stub 247 are no longer shown within ILD 41 because they all comprise oxide in this embodiment, but it is understood that they can be present in the final structure.

Figure 15:
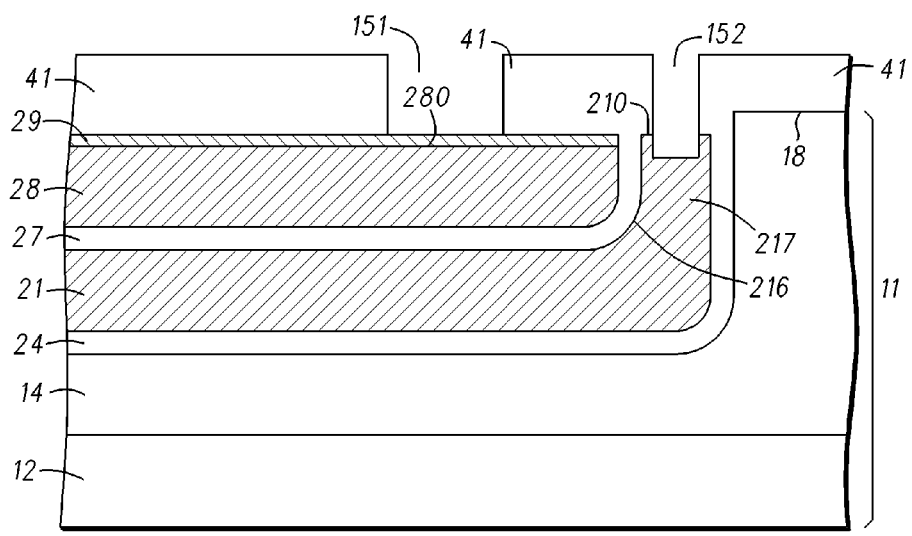

FIG. 15 shows structure 40 after trench openings 151 and 152 have been formed in ILD 41 to expose a portion of silicide layer 29 and shield electrode 21. Conventional photolithography and etch steps are used to form openings 151 and 152. Next, exposed portions of shield electrode 21 are further etched to recess part of portion 217 below surface 210.

Figure 16:
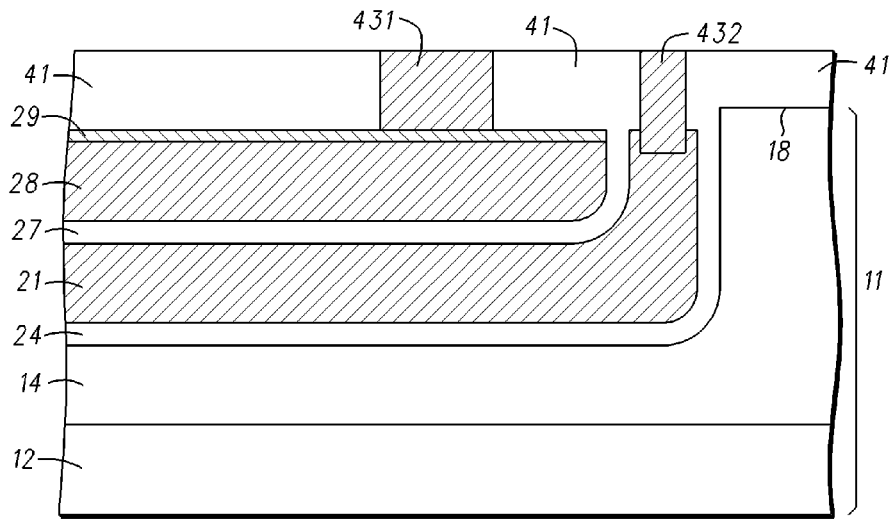

Next, conductive structures or plugs 431 and 432 are formed within openings 151 and 152 respectively as shown in FIG. 16. In one embodiment, conductive structures 431 and 432 are titanium/titanium-nitride/tungsten plug structures, and are formed using conventional techniques. In one embodiment, conductive structures 431 and 432 are planarized using, for example, chemical mechanical planarization so the upper surfaces of ILD 41 and conductive structures 431 and 432 are more uniform. Thereafter, a conductive layer is formed overlying structure 40 and patterned to form conductive gate runner 56, shield electrode runner 66 and source metal layer 44 as shown in FIG. 4. In one embodiment, conductive layer 44 is titanium/titanium-nitride/aluminum-copper or the like. A feature of this embodiment is that the same conductive layer is used to form source electrode 44, gate runners 54 and 56, and shield electrodes 56 and 66 as shown in FIG. 2. Additionally, conductive layer 46 is formed adjacent substrate 12 as shown in FIG. 4. In one embodiment, conductive layer 46 is a solderable metal structure such as titanium-nickel-silver, chromium-nickel-gold, or the like.

Figure 17:
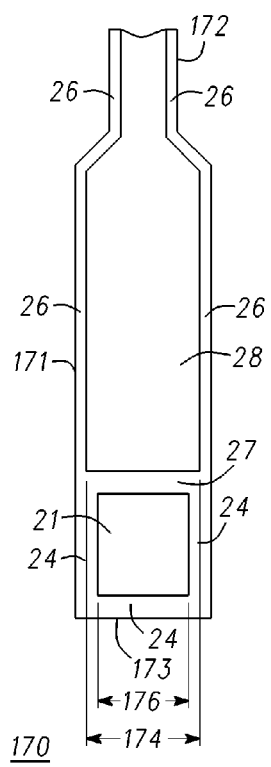
FIG. 17 illustrates a partial top plan view of a contact structure in accordance with a first embodiment.

FIG. 17 is a partial top plan view of a contact or connective structure 170 according to a first embodiment that is configured to provide a contact structure for making contact to gate electrodes 28 and shield electrodes 21 within or inside of trenches 22. That is, structure 170 is configured so that conductive contact to gate electrode 28 and shield electrode 21 can be made inside of or within trenches 22. For perspective, connective structure 170 is one embodiment of a top view of structure 40 without conductive gate runner 56, shield electrode runner 66, conductive structures 431 and 432, and ILD 41. This view also shows insulator layer 26 adjacent gate electrode 28 as shown in FIG. 1. Additionally, this view shows one advantage of this embodiment. In particular, shield electrode 21 in connective structure 170 is surrounded by insulator layers 24 and 27, which are thicker than insulator layers 26. This feature reduces the oxide breakdown problem with previously known structures, which provides a more reliable device. In this embodiment, structure 170 is striped shape and contact to both gate electrodes 28 and shield electrodes 21 is made within a wider or flared portion 171. Structure 170 then tapers down to a narrower portion 172 as it approaches, for example, the active area of the device. As shown in FIG. 17, gate electrode 28 has a width 174 within flared portion 171 that is wider than width 176 of shield electrode 21 within flared portion 171. In this embodiment, end portion 173 of trench 22 terminates with a shield electrode 21, which is surrounded by insulator layers 24 and 27, which are thicker than insulator layer or gate dielectric layer 26. In one embodiment, end portion 173 is adjacent to or in proximity to edge 201 or edge 202 of device 20 or device 30 shown in FIGS. 2 and 3.

Figure 18:
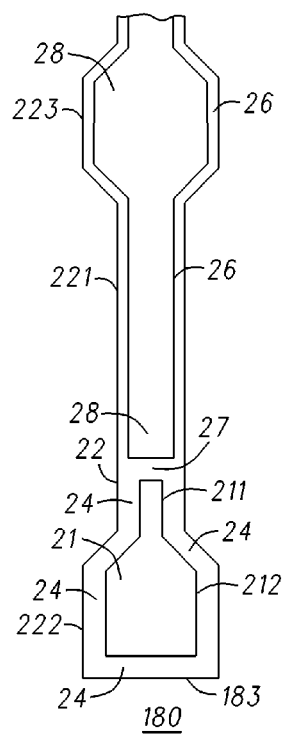
FIG. 18 illustrates a partial top plan view of a contact structure in accordance with a second embodiment.

FIG. 18 is a partial top plan view of a contact connective structure 180 according to a second embodiment that is configured to provide a contact structure for making contact to gate electrodes 28 and shield electrodes 21 formed within or inside of trenches 22. That is, structure 180 is configured so that conductive contact to gate electrode 28 and shield electrode 21 can be made inside of or within trenches 22. In this embodiment, structure 180 includes a thin stripe portion 221 and a flared portion 222 that is wider than stripe portion 221. In this embodiment, flared portion 222 provides a wider contact portion for making contact to shield electrode 21. Structure 180 further includes another separate flared portion 223 that is wider than stripe portion 221 for making contact to gate electrode 28. Like structure 170, shield electrode 21 is surrounded by insulator layers 24 and 27, which are thicker than insulator layers 26. In one embodiment, shield electrode 21 includes a narrow portion 211 within stripe portion 221 and a wider portion 212 within flared portion 222. In this embodiment, insulator layer 24 is within flared portion 222 and further extends into thin stripe portion 221. In this embodiment insulator layer 26 is only within thin stripe portion 221 and flared portion 223. In this embodiment, end portion 183 of trench 22 terminates with a shield electrode 21, which is surrounded by thicker insulator layers 24 and 27. In one embodiment, end portion 183 is adjacent to or in proximity to edge 201 or edge 202 of device 20 or device 30 shown in FIGS. 2 and 3.

Figure 19:
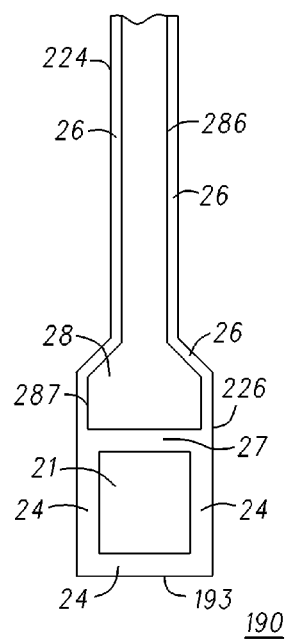
FIG. 19 illustrates a partial top plan view of a contact structure in accordance with a third embodiment.

FIG. 19 is a partial top plan view of a contact or connective structure 190 according to a third embodiment that is configured to provide a contact structure for making contact to gate electrode 28 and shield electrode 21 within or inside of trench 22. That is, structure 90 is configured so that conductive contact to gate electrode 28 and shield electrode 21 is made inside of or within trenches 22. In this embodiment, trench 22 includes a thin stripe portion 224 and a flared portion 226 that is wider than stripe portion 224. In this embodiment, flared portion 226 provides a wider contact portion for making contact to both gate electrode 28 and shield electrode 21. Shield electrode 21 is surrounded by thicker insulator layers 24 and 27, which is thicker than insulator layers 26. In one embodiment, gate electrode 28 includes a narrow portion 286 within thin stripe portion 224 and a wider portion 287 within flared portion 226. In this embodiment, insulator layer 26 is within thin stripe portion 224 and further extends into flared portion 226. In this embodiment, thicker insulator layers 24 and 27 are only within flared portion 224. In one embodiment, shield electrode 21 is within flared portion 226 only. It is understood that combinations of structures 170, 180 and 190 or individual structures 170, 180, and 190 can be used in structure 40 with devices 20 and 30. In this embodiment, end portion 193 of trench 22 terminates with a shield electrode 21, which is surrounded by with thicker insulator layers 24 and 27. In one embodiment, end portion 193 is adjacent to or in proximity to edge 201 or edge 202 of device 20 or device 30 shown in FIGS. 2 and 3.

Figure 20:
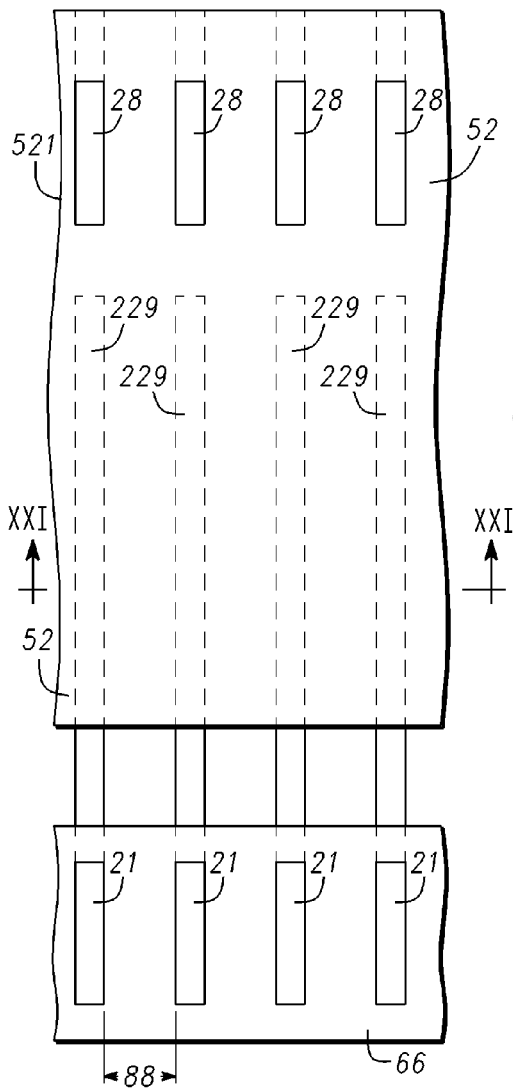
FIG. 20 illustrates a partial top plan view of the semiconductor device of FIG. 2 including a first embodiment of a shielding structure.

Turning now to FIGS. 20-23, various shielding structure embodiments are described. FIG. 20 shows a partial top plan view of a trench shielding structure 261 according to a first embodiment. Shielding structure 261 is suitable for use with, for example, devices 20 and 30, and is conveniently formed using the processing steps used to form device or cell 10 and structure 40 described previously. Shielding structure 261 is an embodiment of a shielding structure that runs at least partially below or underneath gate pad 52 to better isolate or insulate gate pad 52 from semiconductor layer 14. Structure 261 includes a plurality of trenches 229, which are formed at least in part underneath gate pad 52. Trenches 229 are conveniently formed at the same time as trenches 22. Portions of trenches 229 are shown in phantom to illustrate that they are underneath gate pad 52 and shield electrode runner 66.

Figure 21:
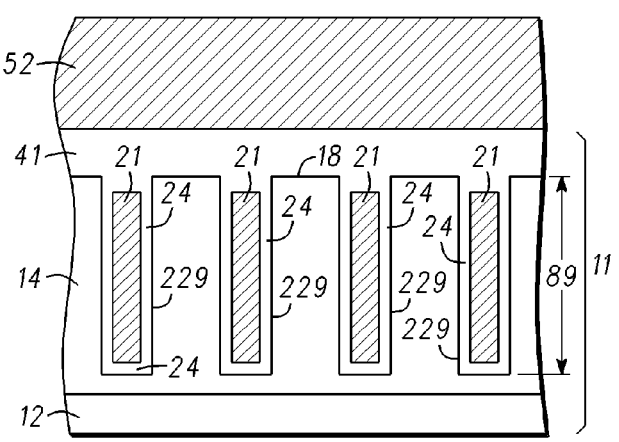
FIG. 21 illustrates a cross-sectional view of the shielding structure of FIG. 20 taken along reference line XXI-XXI.

As further shown in FIG. 21, which is a partial cross-sectional view of structure 261 taken along reference line XXI-XXI of FIG. 20, in structure 261 trenches 229 are each lined with insulator layer 24 and include a shield electrode 21. However, in one embodiment of structure 261 trenches 229 do not contain any gate electrode material 28. That is, in this embodiment structure 261 does not include any gate or control electrodes. As shown in FIG. 20, shield electrodes 21 are connected to shield electrode runner 66, and in one embodiment are electrically connected to source metal 44. In another feature of the present embodiment, ILD 41 separates shield electrodes 21 from gate pad 52 and there are no other intervening polycrystalline or other conductive layers overlying major surface 18 between gate pad 52 and structure 261. That is, structure 261 is configured to better isolate gate pad 52 from semiconductor region 11 without adding more shielding layers overlying the major surface as used in previously known devices. This configuration helps to reduce gate-to-drain capacitance and does so without extra masking and/or processing steps. In one embodiment, spacing 88 between adjacent trenches 229 in structure 261 is less than about 0.3 microns. In another embodiment spacing 88 is less than one half the depth 89 (shown in FIG. 21) of trenches 22 to provide a more optimum shielding. In one embodiment it was found that a spacing 88 of about 0.3 microns provides about a 15% reduction in gate-to-drain capacitance compared to a spacing 88 of 1.5 microns. In one embodiment of structure 261, trenches 229 and shield electrodes 21 do not pass all of the way below gate pad 52. In another embodiment, structure 261 and shield electrodes 21 pass all of the way the past gate pad 52. In a still further embodiment, gate pad 52 contacts gate electrode 28 at an edge portion 521 of gate pad 52 as shown in FIG. 20.

Figure 22:
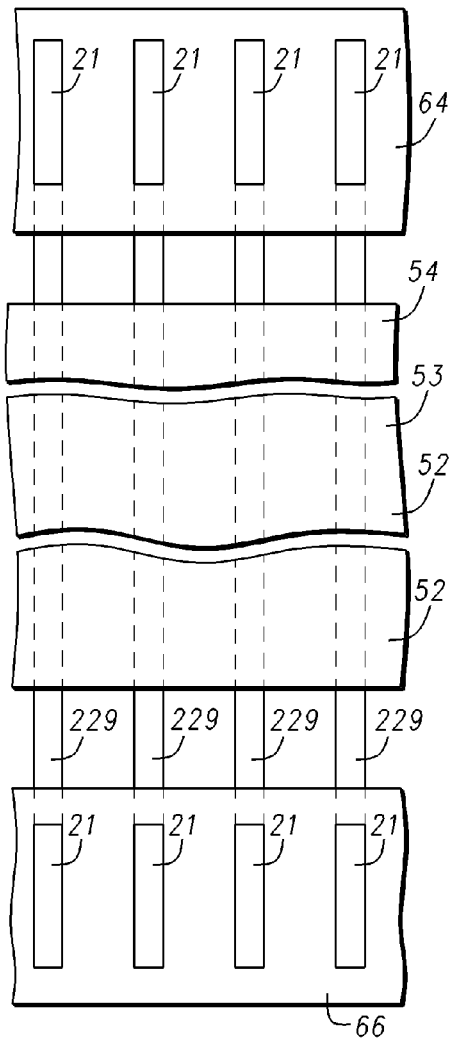
FIG. 22 illustrates a partial top plan view of the semiconductor device of FIG. 2 including a second embodiment of a shielding structure.

FIG. 22 shows a partial top plan view of a trench shielding structure 262 according to a second embodiment. Structure 262 is similar to structure 261 accept that structure 262 is placed to pass a plurality of trenches 229 and shield electrodes 21 below or underneath gate pad 52 and gate runner 53 to further isolate gate pad 52 and gate runner 53 from semiconductor layer 14. In one embodiment of structure 262, contact is made to shield electrodes 21 at both shield electrode runners 64 and 66 as shown in FIG. 22, which are further connected to source metal 44. Structure 262 is configured to better isolate gate pad 52 and gate runner 53 from semiconductor region 11. In structure 262, a portion of trenches 229 pass all the way past or underneath at least a portion of gate pad 52. That is, in one embodiment at least one trench 229 extends from at least one edge or side of gate pad 52 to another opposing edge of gate pad 52.

Figure 23:
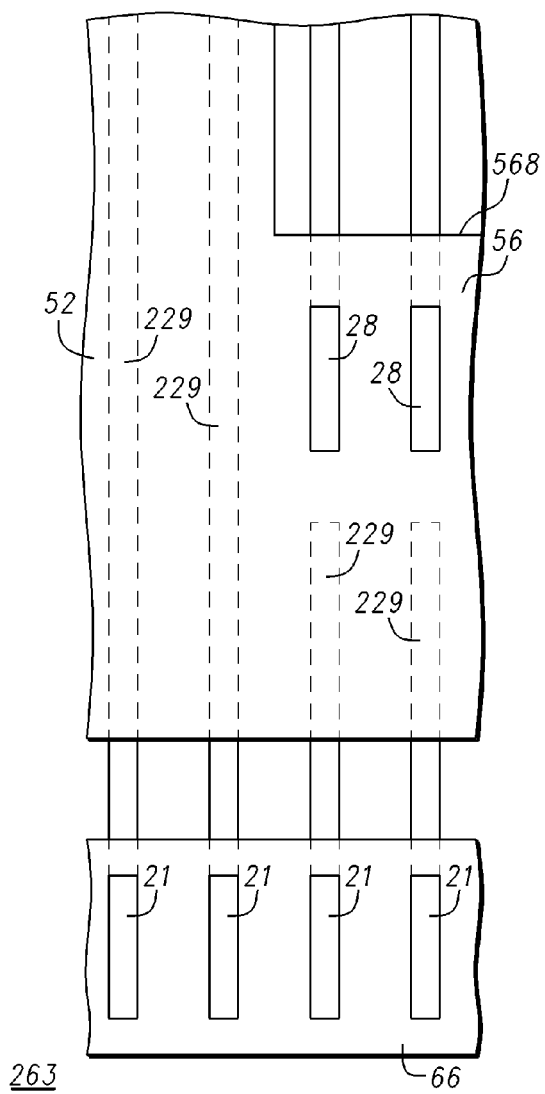
FIG. 23 illustrates a partial top plan view of the semiconductor device of FIG. 2 including a third embodiment of a shielding structure.

FIG. 23 shows a partial top plan view of a trench shielding structure 263 according to a third embodiment. Structure 263 is similar to structure 261 accept that structure 263 is placed to pass a plurality of trenches 229 and shield electrodes 21 below or underneath gate pad 52 and at least a portion of gate runner 56. In one embodiment, a portion of trenches 229 and shield electrodes 21 below gate runner 56 pass all the way below or past gate runner 56. In another embodiment, a portion of trenches 229 and shield electrodes 21 below gate runner 56 only pass a part of the way below gate runner 56. In another embodiment, a portion of gate runner 56 makes contact to gate electrodes 28 at an edge portion 568 as shown in FIG. 23. Structure 263 is configured to better isolate gate pad 52 and at least a portion of gate runner 56 from semiconductor layer 14. It is understood that all, one or combinations of structures 261, 262, and 263 can be used with, for example, devices 20 and 30.

Figure 24:
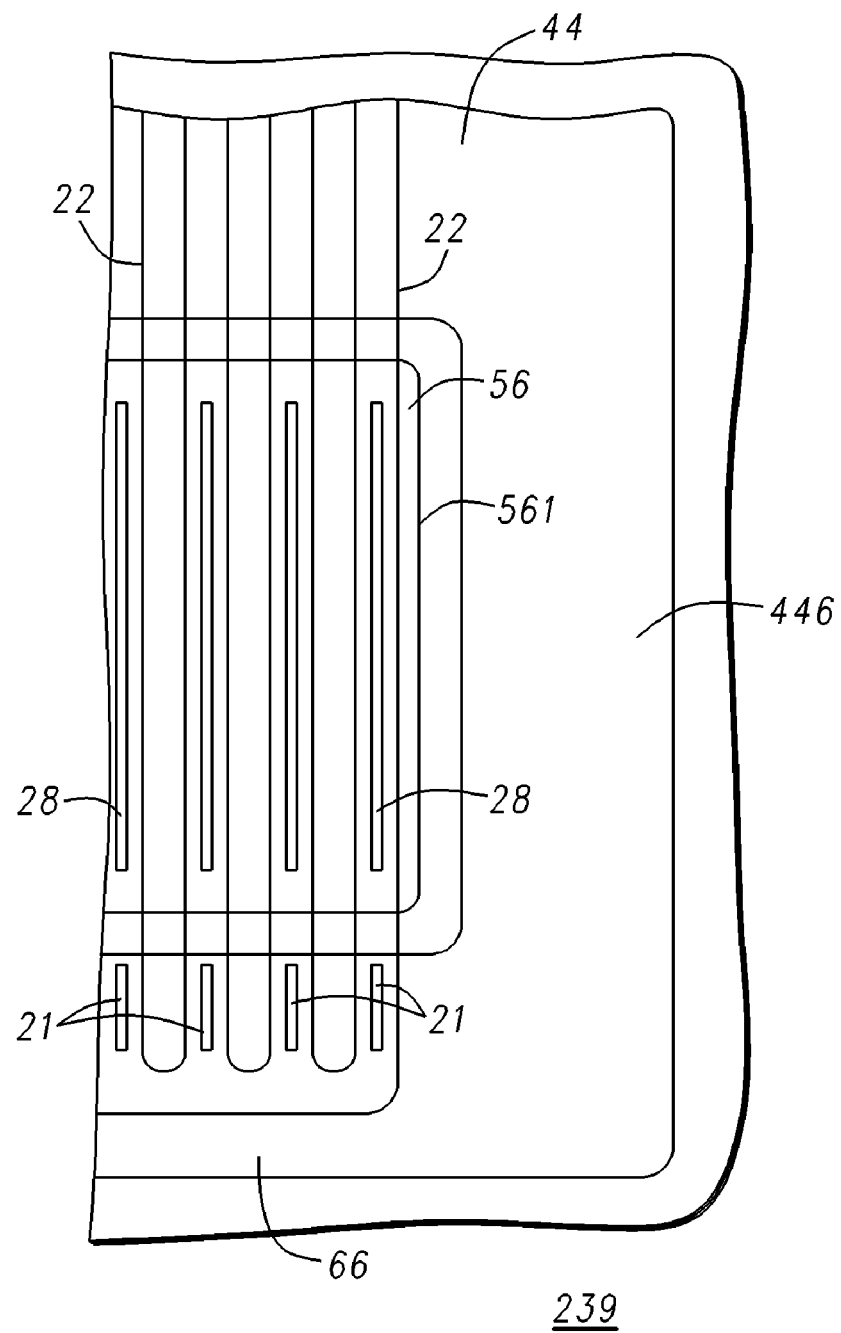
FIG. 24 illustrates a partial top plan view of a portion of the semiconductor device of FIG. 2.

FIG. 24 shows a partial top plan view of structure 239 from device 20 shown in FIG. 2. As shown in FIG. 24, conductive layer 44 includes portion 446, which wraps around end 561 of gate runner 56 and connects to shield electrode runner 66 where contact is made to shield electrodes 21. FIG. 24 further shows an example of the location of trenches 22 and gate electrodes 28 where contact is made between gate runner 56 and gate electrode 28. Additionally, FIG. 24 shows trenches 22 having a striped shape and extending in a direction from the active area where conductive layer 44 is to the contact area where gate runner 56 and shield runner 66 are located. It is understood that the connective structures of FIGS. 17, 18 and 19 can be used with structure 239 either individually or in combination. Structure 239 further illustrates an embodiment that provides for the use of one metal layer to connect the various structures.

In summary, a contact structure for a semiconductor device having a trench shield electrode has been described including a method of manufacture. The contact structure includes a gate electrode contact portion and a shield electrode contact portion within a trench structure. Contact is made to the gate electrode and the shield electrode within or in side the trench structure. The shield electrode contact portion is surrounded by a passivating layer that is thicker that the passivating layer used to form a gate dielectric layer. Additionally, several contact structure embodiments have been described that included flared portions for making contact to the gate and shield electrodes. The structures and method described herein improve the integration of shield electrodes with power devices and further improves reliability.

Although the invention has been described and illustrated with reference to specific embodiments thereof, it is not intended that the invention be limited to these illustrative embodiments. Those skilled in the art will recognize that modifications and variations can be made without departing from the spirit of the invention. Therefore, it is intended that this invention encompass all such variations and modifications as fall within the scope of the appended claims.

We claim:

1. A semiconductor device structure comprising:
a region of semiconductor material having a major surface;
a first trench structure formed in the region of semiconductor material, wherein the first trench structure includes a control electrode layer and a shield electrode layer;
a contact structure formed in the region of semiconductor material, wherein the first trench structure terminates in the contact structure, and wherein upper surfaces of both the control electrode layer and the shield electrode layer in the contact structure are recessed within the first trench without overlapping the major surface of the region of semiconductor material in the contact structure;
a first conductive layer coupled to the control electrode layer within the first trench structure; and
a second conductive layer coupled to the shield electrode layer within the first trench structure.

2. The structure of claim 1, wherein the first trench structure includes a gate dielectric layer separating the control electrode layer from the region of semiconductor material, and wherein the shield electrode layer in the contact structure is separated from the control electrode layer at the major surface by an insulator layer that is thicker than the gate dielectric layer.

3. The structure of claim 1, wherein the first and second conductive layers comprise conductive plugs.

4. The structure of claim 1, wherein the structure includes an active region separate from the contact structure, and wherein the structure further comprises a contact region formed within the active region for further contacting the shield electrode layer within the active region.

5. The structure of claim 1, wherein the first trench structure extends from an active region of the semiconductor device to the contact structure, wherein the second conductive layer makes contact to the shield electrode layer adjacent an edge of the semiconductor device, and wherein the first conductive layer is between the active area and the second conductive layer.

6. The structure of claim 1, wherein the control electrode layer is separated from the region of semiconductor material by a first insulator layer, and wherein the shield electrode layer is separated from the region of semiconductor material by a second insulator layer, and wherein the control electrode layer is separated from the shield electrode layer by a third insulator layer, wherein the second and third insulator layers are thicker than the first insulator layer.

7. The structure of claim 6, wherein the third insulator layer is thinner than the second insulator layer.

8. The structure of claim 6, wherein the second and third insulator layers separate the shield electrode layer from the control electrode layer in proximity to the major surface in the contact region.

9. The structure of claim 6, wherein the first trench structure includes a flared portion in the contact structure, and wherein the second and third insulator layers separate the shield electrode layer from the control electrode layer in the flared portion.

10. The structure of claim 1, wherein the first trench structure comprises a first flared portion in the contact structure, and wherein the first conductive layer makes contact to the control electrode layer in the first flared portion.

11. The structure of claim 10, wherein the second conductive layer makes contact to the shield electrode layer in the first flared portion.

12. The structure of claim 10, wherein the first trench structure comprises a second flared portion in the contact structure different than the first flared portion, and wherein the second conductive layer makes contact to the shield electrode layer in the second flared portion.

13. A semiconductor device structure comprising:
a region of semiconductor material having a major surface, an active area, and a contact area;
a trench having a striped shape formed in the region of semiconductor material and extending from the active area to the contact area;
a shield electrode formed in the trench and separated from the region of semiconductor material by a first insulator layer;
a control electrode formed in the trench and separated from the region of semiconductor material by a second insulator layer and separated from the shield electrode by a third insulator layer, wherein shield electrode and the control electrode terminate in the contact area without overlapping the major surface of the region of semiconductor material in the contact area, and wherein the shield electrode and the control electrode are recessed below the major surface of the region of semiconductor material in the contact area;
a first conductive structure contacting the control electrode inside the trench within the contact area; and
a second conductive structure contacting the shield electrode inside the trench within the contact area.

14. The structure of claim 13, wherein the first and third insulator layers are thicker than the second insulator layer, and wherein the first and third insulator layers isolate the shield electrode from the control electrode adjacent the major surface in the contact area.

15. The structure of claim 13, wherein the trench includes a flared portion within the contact area for making contact to at least one of the control electrode and the shield electrode.

16. The structure of claim 13 further comprising a metal silicide layer formed on the control electrode and extending along the control electrode from the active area to the contact area.

17. The structure of claim 13, wherein the first and second conductive structures comprise metal plugs.

18. A semiconductor device structure comprising:
a region of semiconductor material having a major surface, an active area, and a contact area;
a trench having a striped shape formed in the region of semiconductor material and extending from the active area to the contact area;
a shield electrode formed in the trench and separated from the region of semiconductor material by a first insulator layer;
a control electrode formed in the trench and separated from the region of semiconductor material by a second insulator layer and separated from the shield electrode by a third insulator layer, wherein the shield electrode and the control electrode terminate in the contact area without overlapping the major surface of the region of semiconductor material in the contact area, and wherein the control electrode is recessed below the major surface of the region of semiconductor material in the contact area, and wherein the first and third insulator layers are thicker than the second insulator layer, and wherein the first and third insulator layers isolate the shield electrode from the control electrode adjacent the major surface of the region of semiconductor material in the contact area;
a first conductive structure contacting the control electrode inside the trench within the contact area; and
a second conductive structure contacting the shield electrode within the contact area.

19. The structure of claim 18, wherein the trench includes a flared portion within the contact area, and wherein at least the second conductive structure contacts the shield electrode within the flared portion.

20. The structure of claim 18 further comprising:
a source region formed adjacent the trench in the active area; and
a third conductive structure coupled to the source region in the active area and further coupled to the second conductive structure.

21. The structure of claim 18, wherein the shield electrode includes a transition portion where the shield electrode extends towards the major surface in the contact area, wherein the transition portion is rounded.

22. A method for forming a semiconductor device comprising the steps of:
providing a region of semiconductor material having a major surface, an active area, and a contact area;
forming a trench having a striped shape in the region of semiconductor material and extending from the active area to the contact area;
forming a shield electrode in the trench and separated from the region of semiconductor material by a first insulator layer;
forming a control electrode in the trench and separated from the region of semiconductor material by a second insulator layer and separated from the shield electrode by a third insulator layer, wherein the shield electrode and the control electrode terminate in the contact area without overlapping the major surface of the region of semiconductor material in the contact area, and wherein the shield electrode and the control electrode are recessed below the major surface of the region of semiconductor material in the contact area;

forming a first conductive structure contacting the control electrode inside the trench within the contact area; and forming a second conductive structure contacting the shield electrode inside the trench within the contact area.

* * * * *